United States Patent [19]
Takiguchi et al.

[11] Patent Number: 5,473,173
[45] Date of Patent: Dec. 5, 1995

[54] QUANTUM WELL STRUCTURE HAVING DIFFERENTIALLY STRAINED QUANTUM WELL LAYERS

[75] Inventors: Haruhisa Takiguchi; Kousei Takahashi, both of Nara, Japan; Martin D. Dawson; Geoffrey Duggan, both of Oxon, United Kingdom

[73] Assignee: Sharp Kabushiki Kaisha, Osaka, Japan

[21] Appl. No.: 245,314

[22] Filed: May 18, 1994

[30] Foreign Application Priority Data

May 21, 1993 [JP] Japan .................................. 5-120275

[51] Int. Cl.⁶ ...................... H01L 27/14; H01L 31/04; H01L 29/205
[52] U.S. Cl. .................... 257/185; 257/14; 257/97; 257/190; 257/191
[58] Field of Search ............................... 257/14, 15, 97, 257/190, 191, 185

[56] References Cited

U.S. PATENT DOCUMENTS

| | | | |
|---|---|---|---|
| 4,835,583 | 5/1989 | Morioka et al. | 257/190 |
| 5,048,036 | 9/1991 | Scifres et al. | 257/190 |
| 5,132,746 | 7/1992 | Mendez et al. | 257/190 |
| 5,216,261 | 6/1993 | Inata et al. | 257/185 |
| 5,313,073 | 5/1994 | Kuroda et al. | 257/190 |

FOREIGN PATENT DOCUMENTS

| | | | |
|---|---|---|---|
| 4-32220 | 2/1992 | Japan | 257/190 |
| 4-130689 | 5/1992 | Japan . | |
| 4-180684 | 6/1992 | Japan . | |

OTHER PUBLICATIONS

Harrison, W. A., *Electronic structure and the properties of solids. The physics of the chemical bond.* (1980) W. H. Freeman and Company, San Francisco, USA, pp. 76–81.

Van de Walle, C. G., "Band lineups and deformation potentials in the model–solid theory" *Physical Review B* (1989) 39(3):1871–1883.

Thijs, P. J. A., "Progress in quantum well lasers: Application of strain" *13th IEEE International Semiconductor Laser Conference* (Sep. 21–25, 1992) Takamatsu, Kagawa, Japan, pp. 2–5.

*Primary Examiner*—Mahshid Saadat
*Attorney, Agent, or Firm*—Morrison & Foerster

[57] ABSTRACT

A quantum well structure is provided which is capable of efficiently confining electrons and holes in a quantum well layer. The quantum well structure includes a first cladding layer, a second cladding layer, and a plurality of quantum well layers and one or more barrier layers each disposed between the first cladding layer and the second cladding layer. The quantum well layers and the barrier layers are laminated in an alternating manner. The quantum well layers include at least two selected from the group consisting of a layer having tensile strain, a layer having no strain, and a layer having compressive strain. The thickness of each of the quantum well layers is selected so that the energy difference in each of the quantum well layers between the ground quantum state of an electron at the conduction band and the ground quantum state of a hole at the valence band is substantially the same.

10 Claims, 7 Drawing Sheets

QUANTUM WELL STRUCTURE HAVING DIFFERENTIALLY STRAINED QUANTUM WELL LAYERS

BACKGROUND OF THE INVENTION

1. Field of the Invention

The present invention relates to a quantum well structure, more particularly to a quantum well structure capable of efficiently confining electrons and holes, and to a semiconductor laser utilizing such a quantum well structure.

2. Description of the Related Art

In a semiconductor light emitting device such as a semiconductor laser and a light emitting diode, electrons and holes injected into an active layer of the device combine with each other and emit light. Accordingly, it is important to efficiently confine the electrons and holes in the active layer in order to improve characteristics of the light emitting device. A conventional semiconductor laser has a double hetero structure, in which an active layer is sandwiched between a p-type cladding layer and an n-type cladding layer. Compound semiconductors for forming the double hetero structure are selected so that the forbidden gap of the active layer is smaller than the forbidden gap of the p-type cladding layer and the n-type cladding layer. This energy difference ($\Delta Eg$) between the forbidden gaps generates energy barriers as the band offset ($\Delta Ev$) of the valence band and the band offset ($\Delta Ec$) of the conduction band. These energy barriers, when sufficiently high, can achieve efficient confinement of the injected electrons and holes in the active layer.

Recently, owing to developments in crystal growth techniques, it has become possible to grow an ultra-thin film having a thickness of several nanometers (nm). Thus, a quantum well semiconductor laser can be manufactured using such an ultra-thin film as an active layer of the laser. In a quantum well layer (i.e., an active layer made of an ultra-thin film by which quantum effects of electrons and holes are obtained) of the quantum well semiconductor laser, electrons and holes each have a discrete energy level. As a result, the quantum well semiconductor laser has advantages such as a decrease in the threshold current density due to an increase in the state densities, emission of laser light having a shorter wavelength, and the like.

An example of conventional semiconductor lasers includes a red semiconductor laser which is made of AlGaInP/GaAs type compound semiconductors and has an emission wavelength in the range from 630 to 670 nm. An attempt has been made to further shorten the emission wavelength of the red semiconductor laser by applying tensile strain to a quantum well layer. This tensile strain is generated by forming the quantum well layer from a compound semiconductor having a smaller lattice constant than those of compound semiconductors used for the cladding layers and the substrate. However, it is believed that in such a red semiconductor laser, the band offset ($\Delta Ec$) of the conduction band is not sufficiently large. Thus, when the amount of injected carriers (electrons and holes) is increased in an operation at a higher temperature, the electrons tend to overflow from the quantum well layer to the p-type cladding layer, thereby deteriorating the characteristics of the semiconductor laser.

Another type of quantum well semiconductor laser includes that which is made of group II-VI semiconductors and recently reported to successfully emit a blue light. Such a blue semiconductor laser also has a similar problem to that mentioned above. For example, in the blue semiconductor laser in which a quantum well layer, cladding layers and a substrate are respectively made of ZnMgSSe, ZnSSe and GaAs, neither the band offset ($\Delta Ev$) of the valence band nor the band offset ($\Delta Ec$) of the conduction band is sufficiently large. Also, in the case of a quantum well semiconductor laser in which group VI elements included in a quantum well layer are the same as those included in the cladding layers, such as a semiconductor laser having a quantum well layer, cladding layers and a substrate respectively made of ZnCdMgS, ZnCdMgS and GaAs, the band offset of the valence band ($\Delta Ev$) is very small. Because of this small $\Delta Ev$, the injected holes tend to overflow from the quantum well layer to the n-type cladding layer, resulting in difficulty of the semiconductor laser in oscillating at a higher temperature.

In order to overcome the above-mentioned problems, a semiconductor laser having a structure as shown in FIG. 8 has been proposed (Japanese Laid-open Publication No. 4-180684). In this semiconductor laser, an n-type carrier confining layer 803 is disposed between an active layer 804 and an n-type cladding layer 802, and a p-type carrier confining layer 805 is disposed between an active layer 804 and a p-type cladding layer 806. The carrier confining layers 803 and 805 are each made of $(Al_{0.6}Ga_{0.4})_{0.6}In_{0.4}P$, and each has tensile strain due to a lattice mismatching. Because of these mismatchings, an energy gap of each of the carrier confining layers 803 and 805 is enlarged without being accompanied by an increase in the specific resistance thereof. However, the thickness of each of the carrier confining layers 803 and 805 is limited to such a thickness as to avoid the elastic breakdown (i.e., a thickness not greater than the critical thickness), and thus it is extremely difficult to prevent the electrons from over-flowing to the p-type cladding layer due to the tunnel effect. Therefore, even the semiconductor laser of FIG. 8 is believed to be unsatisfactory regarding the efficiency of confining the carriers.

SUMMARY OF THE INVENTION

The present invention provides a quantum well structure including a first cladding layer, a second cladding layer, and a plurality of quantum well layers and one or more barrier layers each disposed between the first cladding layer and the second cladding layer, the quantum well layers and the barrier layers being laminated in an alternating manner, wherein the quantum well layers include at least two selected from the group consisting of a layer having tensile strain, a layer having no strain, and a layer having compressive strain, and wherein the thickness of each of the quantum well layers is selected so that the energy difference in each of the quantum well layers between the ground quantum state of an electron at the conduction band and the ground quantum state of a hole at the valence band is substantially the same.

The quantum well structure according to the present invention may be utilized as an active region of a semiconductor light emitting device, such as a semiconductor laser.

The present invention provides a quantum well structure capable of efficiently confining electrons and holes in a quantum well layer. Further, the present invention can provide a device such as a semiconductor laser, which utilizes this quantum well structure and has improved characteristics such as those observed in an operation at a higher temperature.

These and other advantages of the present invention will become apparent to those skilled in the art upon reading and understanding the following detailed description with reference to the accompanying figures.

BRIEF DESCRIPTION OF THE DRAWINGS

FIG. 3b is a schematic view illustrating various energy values for the three kinds of quantum well layers as shown in FIG. 2a.

DETAILED DESCRIPTION OF THE INVENTION

Figure 1:
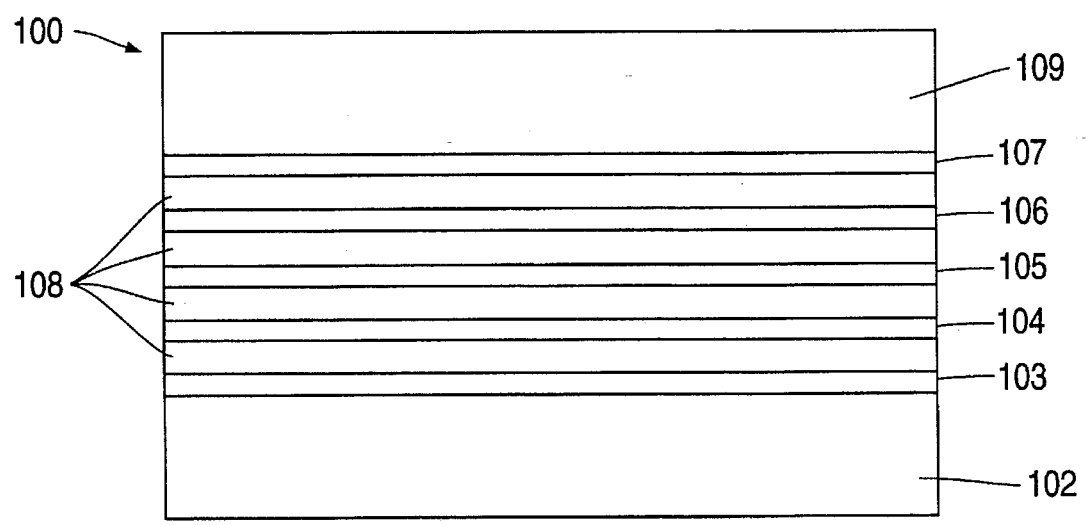
FIG. 1 is a schematic front view illustrating an embodiment of the quantum well structure according to the present invention.

The band offset in a hetero structure made of compound semiconductors is generally explained by Harrison's tight binding theory. See, for example, W. A. Harrison, Electric Structure and Properties of Solids—The physics of chemical bond, p. 77, W. H. Freeman and Company, San Francisco, 1980. According to the above theory, the highest energy level (Evmax) of the valence band of a compound semiconductor and the lowest energy level (Ecmin) of the conduction band thereof are respectively represented by the following Formulae (1) and (2):

$$Evmax=(Ep^c+Ep^a)/2-[((Ep^c-Cp^a)/2)^2+Vxx^2]^{1/2} \quad (1)$$

$$Ecmin=(Es^c+Es^a)/2-[((Es^c-Es^a)/2)^2+Vss^2]^{1/2} \quad (2)$$

wherein $Ep^c$ and $Ep^a$ are the p-state energy of the cation and that of the anion, $Es^c$ and $Es^a$ are the s-state energy of the cation and that of the anion, Vxx and Vss are the interatomic matrix elements between p-states of neighboring atoms and that between s-states of neighboring atoms, all of which are obtained as theoretical values corrected by experimental data. Thus, the band offset ($\Delta Ev$) of the valence band which is formed within a hetero junction (a junction between a cladding layer and an active layer), is provided as the difference of Evmax between compound semiconductors used in the cladding layer and the active layer. Similarly, the band offset ($\Delta Ec$) of the conduction band which is formed within the hetero junction is provided as a difference of Ecmin between the compound semiconductors used in the cladding layer and the active layer.

Further, changes in the energy band structure in the case where strain is applied to a quantum well layer of a hetero structure are calculated based on the following Formulae (3) and (4):

$$Ev,hh, \text{strain}=[Ev-(\tfrac{1}{3})\Delta_0j+dEv,ac+dEv, hh \quad (3)$$

$$Ec,\text{strain}=Ecmin+dEc \quad (4)$$

wherein Ev,hh, strain is the energy level of heavy holes in the valence band in the case where the strain is applied; Ev is the energy level in an unstrained state obtained from the Formula (1); $\Delta_0$, dEv, av, and dEv,hh are changes in the energy which are generated by the strain; Ec, strain is the energy level in the conduction band in the case where the strain is applied; Ecmin is the energy level in an unstrained state obtained from the Formula (2); dec is a change in the energy which is generated by the strain. See, for example, C. C. Van de Walle, *Phys. Rev. B*, 839, 1871 (1989).

Accordingly, by using the Formulae (1) through (4), it is theoretically possible to calculate the band offset ($\Delta Ev$) of the valence band and the band offset ($\Delta Ec$) of the conduction band formed in a double hetero structure composed of any combination of compound semiconductors, in which strain is applied to an active layer. However, it has not been known whether the Formulae (1) through (4) are practically applicable to various kinds of double hetero structures.

Herein, the term "band offset of the conduction band" means the difference between the energy level at the conduction band of an active layer such as a quantum well layer, and the energy level at the conduction bands of a cladding layer. Similarly, the term "band offset of the valence band" means the difference between the energy level at the valence band of the active layer, and the energy level of the valence bands of the cladding layer.

The present inventors studied changes in the energy band of a quantum well structure, which were generated by applying strain stress to a quantum well layer of the quantum well structure. As a result, the following facts are found regarding a quantum well structure in which a quantum well layer and cladding layers are respectively made of GaInP and AlGaInP. That is, when the quantum well layer has compressive strain, the band offset $\Delta Ec$ increases and the band offset $\Delta Ev$ decreases. On the other hand, when the quantum well layer has tensile strain, the band offset dec decreases and the band offset $\Delta Ev$ increases. This confirms that trends indicated by the Formulae (1) through (4) are applicable to this GaInP/AlGaInP type quantum well structure.

Figure 3A:
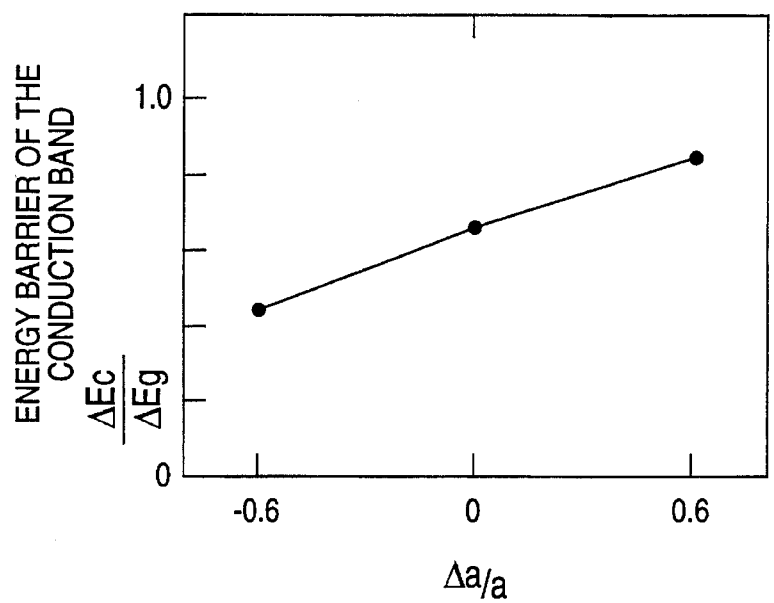
FIG. 3a is a graph illustrating the relationship between the degree of strain in a quantum well layer and the energy barrier of the conduction band.

FIG. 3a is a graph illustrating some measurements obtained by using a quantum well structure in which a cladding layer, a quantum well layer, and another cladding layer are respectively made of un-$(Al_{0.7}Ga_{0.3})_{0.52}In_{0.48}P$, $Ga_{1-x}In_xP$, and un-$(Al_{0.7}Ga_{0.3})_{0.52}In_{0.48}P$. This graph supports the above-mentioned relationship between compressive or tensile strain and the band offset $\Delta Ec$ or $\Delta Ev$.

In FIG. 3a, the axis of abscissa shows a lattice mismatching rate $\Delta a/a$ and represents the degree of strain applied to the quantum well layer. The axis of ordinate shows the ratio of the band offset ($\Delta Ec$) of the conduction band to the energy difference ($\Delta Eg$) between the forbidden gaps. Herein, the lattice mismatching rate $\Delta a/a$ is represented by the following formula:

$$\frac{\Delta a}{a} = (Lq - Lc)/Lq$$

wherein Lq is the lattice constant of a quantum well layer, and Lc is the lattice constant of cladding layers. Herein, the lattice constant means a lattice constant of an unstrained, bulk compound semiconductor for each layer.

Further, the present inventors found additional facts regarding another type of quantum well structure in which a quantum well layer and cladding layers are respectively made of ZnSSe and ZnMgSSe. That is, when the quantum well layer has compressive strain, ΔEc decreases and ΔEv increases. On the other hand, when the quantum well layer has tensile strain, ΔEc increases and ΔEv decreases.

Thus, it was found out that the relationships between compressive or tensile strain and the band offset ΔEc and ΔEv depend on the kinds and combinations of compound semiconductors to be used, and can change in alternative ways.

The present invention applies the above findings to a quantum well structure having a plurality of quantum well layers, thereby enabling it to efficiently confine electrons and holes injected therein. Thus, the present invention allows a layer having compressive strain and/or a layer having tensile strain to be appropriately disposed depending on the kinds of compound semiconductors to be used, with regard to the first and second cladding layers so as to obtain desired effects in the quantum well structure.

More specifically, by increasing the band offset (ΔEc) of the conduction band of a quantum well layer adjacent to the cladding layer through which holes are injected, it is possible to efficiently confine the injected electrons in the quantum well layer. On the other hand, by increasing the band offset (ΔEv) of the valence band of a quantum well layer adjacent to the cladding layer through which electrons are injected, it is possible to efficiently confine the injected holes in the quantum well layer.

Herein, a first cladding layer refers to either a cladding layer through which electrons are injected (which is typically an n-type cladding layer), or a cladding layer through which holes are injected (which is typically a p-type cladding layer). A second cladding layer refers to the other of the two kinds of cladding layers. The terms "first" and "second" are not intended to specify the position of the cladding layers within a quantum well structure.

EXAMPLES

Hereinafter, the present invention will be described by way of illustrating examples.

Quantum Well Structure

FIG. 1 shows an embodiment of the quantum well structure according to the present invention. In this quantum well structure 100, five quantum well layers 103, 104, 105, 106, and 107 each made of $Ga_{1-x}In_xP$ are disposed between an n-type cladding layer 102 made of n-$(Al_{0.5}Ga_{0.5})_{0.52}In_{0.48}P$ and a p-type cladding layer 109 made of p-$(Al_{0.5}Ga_{0.5})_{0.52}In_{0.48}P$. The quantum well layers 103, 104, 105, 106, and 107 are separated from each other by undoped barrier layers 108 each made of un-$(Al_{0.5}Ga_{0.5})_{0.52}In_{0.48}P$. These quantum well layers have three different composition ratios. That is, the quantum well layers 103 and 104 have a composition ratio defined by x=0.39; the quantum well layer 105 has a composition ratio defined by x=0.48; and the quantum well layers 106 and 107 have a composition ratio defined by x=0.56. As a result, the quantum well layers 103 and 104 which are adjacent to the n-type cladding layer 102, have a lattice mismatching rate Δa/a of −0.6% and thus have tensile strain. The quantum well layer 105 which is placed in the middle of the five quantum well layers, has a lattice constant matching with those of the cladding layers 102 and 109 and the barrier layers 108 and thus has no strain. The quantum well layers 106 and 107 which are adjacent to the p-type cladding layer 109, have a lattice mismatching rate Δa/a of 0.6% and thus have compressive strain.

In the quantum well structure 100 shown in FIG. 1, the thicknesses of the respective layers are as follows: the n-type cladding layer 102, about 2.00 micrometers (μm); the p-type cladding layer 109, about 2.00 μm; the quantum well layers 103 and 104, about 6.00 nanometers (nm); the quantum well layer 105, about 2.00 nm; the quantum well layers 106 and 107, about 3.50 nm; and the undoped barrier layers 108, about 10.00 nm. The thickness of each quantum well layer is selected so that an energy difference Ege-o thereof is substantially the same as those of the other quantum well layers. The energy difference Ege-o is determined in each quantum well layer as a difference between the ground quantum state of an electron in the conduction band, and the ground quantum state of a hole in the valence band. Herein, the term "substantially the same" in the context of the energy difference Ege-o means that a difference between values of energy differences of two quantum well layers is small enough to assure the quantum well structure to be used to oscillate a laser light having a single wavelength. Also, the thickness of the barrier layers 108 is selected so that the distributions defined by the wave function of electrons for a pair of quantum well layers which are placed in contact with each barrier layer, do not overlap with each other within the barrier layer. A barrier layer having a minimum thickness in the range from about 2 to about 5 nm satisfies this purpose. However, the effect of the present invention can be obtained even when the barrier layer has a thickness smaller than such a minimum thickness.

Figure 2A:
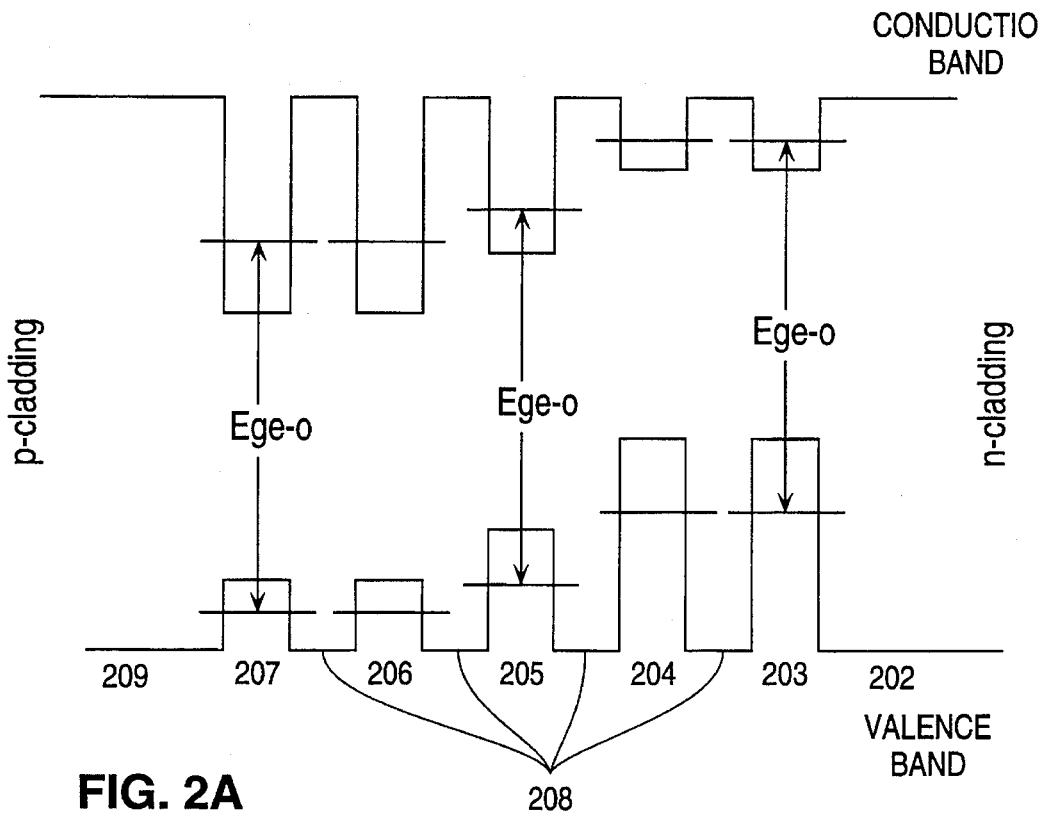
FIG. 2a is a schematic view illustrating the energy band diagram of the quantum well structure of FIG. 1.

FIG. 2a shows the energy band diagram of the quantum well structure 100. In FIG. 2a, portions 202 and 209 of the energy band correspond to the n-type cladding layer 102 and the p-type cladding layer 109 of FIG. 1. Portions 203, 204, 205, 206, and 207 correspond to the quantum well layers 103, 104, 105, 106, and 107. Portions 208 correspond to the undoped barrier layers 108. Each of the portions are separated, in the vertical direction as shown in FIG. 2a, into three areas. The upper area is the conduction band, and the lower area the valence band. The area between the conduction band and the valence band is the forbidden band. The energy difference Ege-o is the same as that defined above. As can be seen from FIG. 1 and FIG. 2a, the band offset (ΔEv) of the valence band in the quantum well layers 103 and 104 each having tensile strain is larger than that in the quantum well layer 105 having no strain. Also, the band offset (ΔEc) of the conduction band in the quantum well layers 106 and 107 each having compressive strain is larger than that in the quantum well layer 105.

Figure 3B:
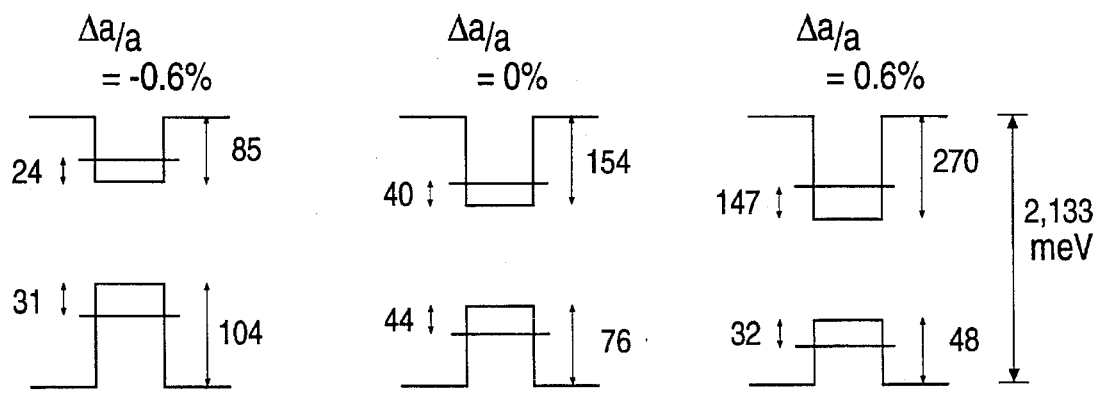

FIG. 3b shows another energy band diagram illustrating three energy bands of quantum well layers among those shown in FIG. 2a, each having a different lattice mismatching rate. FIG. 3b represents for each of these energy bands the band offset of the conduction band, the band offset of the valence band, the energy difference between the ground quantum state of the conduction band and the bottom thereof, and the energy difference between the ground quantum state of the valence band and the top thereof, as well as the forbidden gap in the p-type and n-type cladding layers, by using milli-electron volt (meV) as the energy unit. From these data, the above-mentioned energy difference Ege-o is obtained for each of the three kinds of quantum well layers.

Table 1 lists characteristic values of the above three kinds of quantum well layers, which are the degree of strain (i.e., the lattice mismatching rate) as $\Delta a/a(\%)$; the composition ratio as the ratio of indium, x, in $Ga_{1-x}In_xP$; the relative height of the energy barrier of the conduction band ($\Delta Ec/\Delta Eg$); the relative height of the energy barrier of the valence band ($\Delta Ev/\Delta Eg$); the thickness of the quantum well layer (nm); and the energy difference Ege-o (eV) determined as described above. Herein, $\Delta Eg$ represents a difference in the forbidden gap between the quantum well layer, and the p-type and n-type cladding layers. As can be seen from Table 1, by appropriately selecting the lattice mismatching rates and the thicknesses of the quantum well layers, it is possible to change significantly the band offset ($\Delta Ec$) of the conduction band and the band offset ($\Delta Ev$) of the valence band, and at the same time to set the energy difference Ege-o to be substantially the same.

TABLE 1

|  | Layers having tensile strain (103,104) | Layer having no strain (105) | Layers having compressive strain (106,107) |
| --- | --- | --- | --- |
| Degree of strain $\Delta a/a$ (%) | −0.6 | 0 | 0.6 |
| Composition ratio of In (x) | 0.39 | 0.48 | 0.56 |
| Energy barrier of the conduction band ($\Delta Ec/\Delta Eg$) | 0.45 | 0.67 | 0.85 |
| Energy barrier of the valence band ($\Delta Ev/\Delta Eg$) | 0.55 | 0.33 | 0.15 |
| Thickness of the quantum well layer (nm) | 6.00 | 2.00 | 3.50 |
| Ege-o (eV) | 1.998 | 1.994 | 1.999 |

Figure 2B:
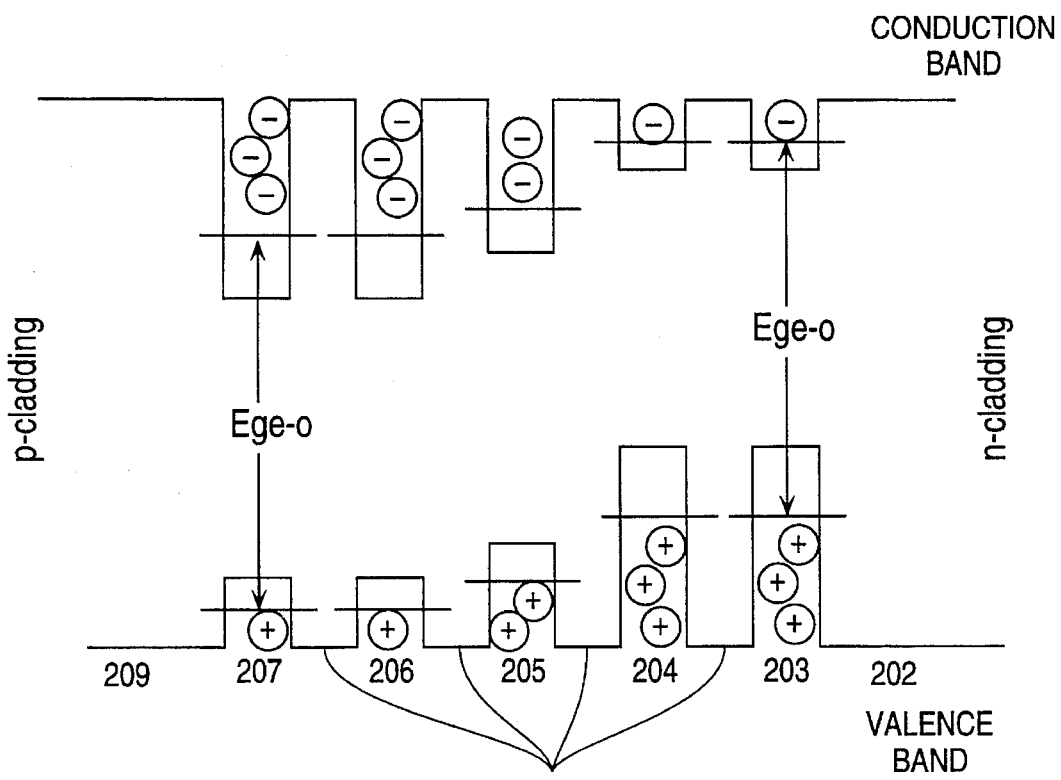
FIG. 2b is a conceptual view illustrating a state wherein electrons and holes are injected into the quantum well structure of FIG. 1.

FIG. 2b is a conceptual view illustrating a state wherein electrons and holes are confined within the quantum well structure 100. Reference numerals 202, 209, 203, 204, 205, 206, 207, and 208, and the energy difference Ege-o are the same as those defined in FIG. 2a.

According to the quantum well structure 100 of the present invention, the following effects can be obtained. First, since the quantum well layers 106 and 107 which are adjacent to the p-type cladding layer 109 have sufficiently large band offsets ($\Delta Ec$) of the conduction band, they can effectively prevent the electrons injected from the n-type cladding layer 102 from overflowing to the p-type cladding layer 109. In addition, since the quantum well layers 103 and 104 which are adjacent to the n-type cladding layer 102 have sufficiently large band offsets ($\Delta Ev$) of the valence band, they can efficiently prevent the holes injected from the p-type cladding layer 109 from over-flowing to the n-type cladding layer 102. Thus, the quantum well structure 100 can efficiently confine both the injected electrons and holes. On the contrary, in the case where a quantum well structure is made using only a plurality of quantum well layers having no strain, neither the band offsets $\Delta Ec$ nor $\Delta Ev$ can be increased satisfactorily, resulting in a tendency of the electrons and the holes to overflow.

Hereinafter will be described examples in which a quantum well structure of the present invention is applied to a semiconductor laser.

Semiconductor Laser

Figure 4:
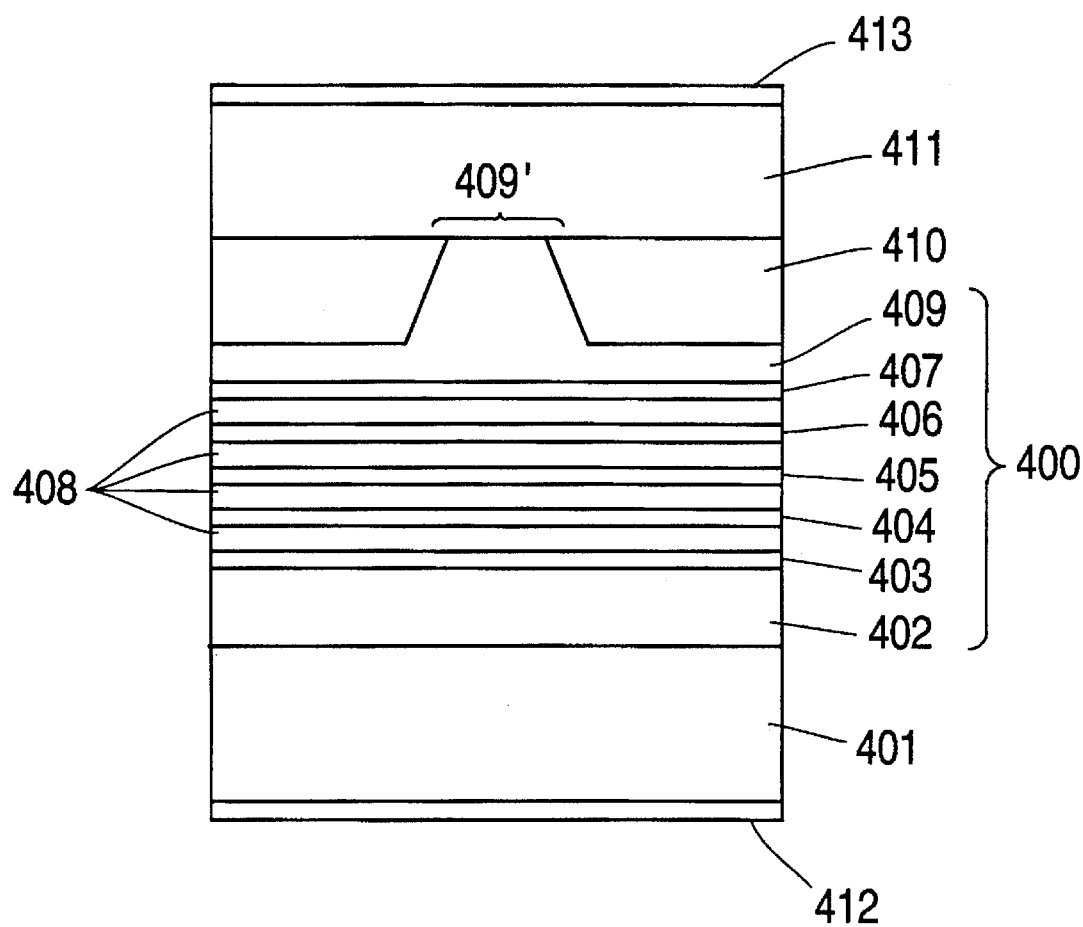
FIG. 4 is a schematic front view illustrating the first, second and third examples of the semiconductor laser which include the quantum well structure of the present invention.

FIG. 4 shows a first example of the semiconductor laser according to the present invention.

This semiconductor laser is composed of a substrate 401 made of n-GaAs, an n-type cladding layer 402 made of n-$(Al_{0.5}Ga_{0.5})_{0.52}In_{0.48}P$, quantum well layers 403 and 404 made of $Ga_{1-x}In_xP$ (x=0.39), a quantum well layer 405 made of $Ga_{1-x}In_xP$ (x=0.48), quantum well layers 406 and 407 made of $Ga_{1-x}In_xP$ (x=0.56), undoped barrier layers 408 made of un-$(Al_{0.5}Ga_{0.5})_{0.52}In_{0.48}P$, a p-type cladding layer 409 made of p-$(Al_{0.5}Ga_{0.5})_{0.52}In_{0.48}P$, current confining layers 410 made of n-GaAs, a contact layer 411 made of p-GaAs, and a pair of electrodes 412 and 413. Thus, an active region 400 of the semiconductor laser is the same as the quantum well structure 100 of FIG. 1.

The semiconductor laser of the present example can be manufactured in the following manner: First, the n-type cladding layer 402, the quantum well layer 403, the barrier layer 408, the quantum well layer 404, the barrier layer 408, the quantum well layer 405, the barrier layer 408, the quantum well layer 406, the barrier layer 408, the quantum well layer 407, the barrier layer 408, and the p-type cladding layer 409 are successively formed in this order on the substrate 401 by using an epitaxial growth method. The epitaxial growth method is one of the known methods used for forming a quantum well layer, such as the metal organic-chemical vapor deposition (MOCVD) method. The thicknesses of the respective layers are set as follows: the n-type cladding layer 402, about 2.00 μm; the p-type cladding layer 409, about 2.00 μm; the quantum well layers 403 and 404, about 6.00 nm; the quantum well layer 405, about 2.00 nm; the quantum well layers 406 and 407, about 3.50 nm; and the barrier layers 408, about 10.00 nm. Next, a stripe portion 409' having a mesa-type cross section, as shown in FIG. 4, is formed in the p-type cladding layer 409 by using a known method. For example, a stripe-shaped mask (not shown in FIG. 4) may be formed on the top face of the p-type cladding layer 409 which is then etched so as to form the stripe portion 409'. Further, current confining layers 410 are formed so as to bury the stripe portion 409'. After the above mask, if present, is removed, the contact layer 411 is formed on the top faces of the stripe portion 409' and the current confining layers 410. Finally, the electrode 412 is formed on the bottom face of the substrate 401, and the electrode 413 on the top face of the contact layer 411, thereby obtaining the semiconductor laser of the first example.

A second example of the semiconductor laser according to the present invention has the same type of laminated structure as that of the semiconductor laser of the first example, and thus will be described with reference to FIG. 4.

This semiconductor laser is composed of a substrate 401 made of n-GaAs, an n-type cladding layer 402 made of n-$Zn_{0.94}Mg_{0.06}S_{0.12}Se_{0.88}$, quantum well layers 403 and 404 made of $ZnS_{1-z}Se_x$ (x=0.88), a quantum well layer 405 made of $ZnS_{1-x}Se_x$ (x=0.92), quantum well layers 406 and 407 of $ZnS_{1-x}Se_x$ (x=0.98), undoped barrier layers 408 made of un-$Zn_{0.94}Mg_{0.06}S_{0.12}Se_{0.88}$, a p-type cladding layer 409 made of p-$Zn_{0.94}Mg_{0.06}S_{0.12}Se_{0.88}$, current confining layers 410 made of n-GaAs, a contact layer 411 made of p-GaAs, and a pair of electrodes 412 and 413. This semiconductor laser can be manufactured in the same manner as described in the first example.

The semiconductor laser of the second example also has five quantum well layers having three different composition ratios, as the semiconductor laser of the first example does. However, as mentioned above, in the case of a quantum well structure made of ZnMgSSe/ZnSSe type semiconductor, the compressive strain or tensile strain applied to a quantum well layer affects the band offsets ΔEc and ΔEv in an opposite manner to the case of the AlGaInP/GaInP type quantum well structure. Thus, in the second example, the quantum well layers 403 and 404 which are adjacent to the n-type cladding layer have compressive strain, the quantum well layer 405 has no strain, and the quantum well layers 406 and 407 which are adjacent to on the p-type cladding layer have tensile strain. The thickness of each quantum well layer is set so that the energy difference Ege-o thereof is substantially the same, as in the cases of the quantum well structure 100 and the semiconductor laser of the first example.

Figure 5:
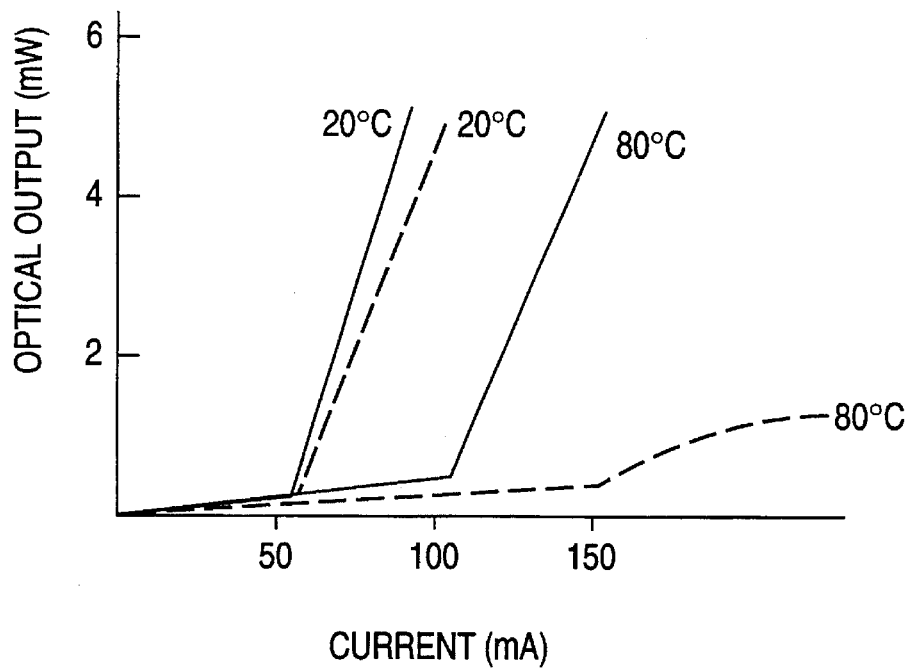
FIG. 5 is a graph illustrating a comparison of the first example of the semiconductor laser of the present invention with a conventional semiconductor laser.
Figure 6:
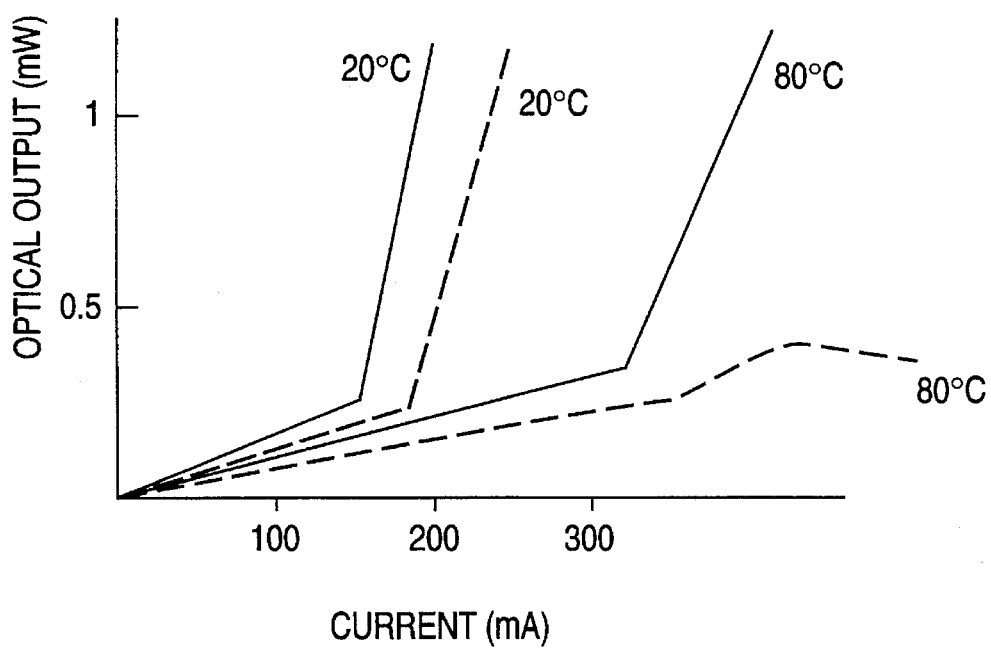
FIG. 6 is a graph illustrating a comparison of the second example of the semiconductor laser of the present invention, with a conventional semiconductor laser.

The semiconductor lasers of the first and second examples both have improved characteristics due to their capability of efficiently confining the injected electrons and holes. FIG. 5 shows the current —optical output characteristics measured by using the semiconductor laser of the first example, at 20° C. and 80° C. (shown in solid lines). As a reference, FIG. 5 also shows the current-optical output characteristics of a semiconductor laser having an unstrained AlGaInP/GaInP quantum well structure, measured under the same condition (shown in dashed lines). FIG. 6 shows the current-optical output characteristics measured by using the semiconductor laser of the second example, at 20° C. and 80° C. (shown in solid lines). As a reference, FIG. 6 also shows the current-optical characteristics of a semiconductor laser having an unstrained ZnMgSSe/ZnSSe quantum well structure, measured under the same condition (shown in dashed lines).

As can be seen from these FIGS. 5 and 6, the semiconductor lasers of the present invention exhibit greatly improved characteristics when operated at a high temperature, as compared with conventional quantum well semiconductor lasers wherein all of the quantum well layers have no strain.

Although the semiconductor laser of the second example has the n-type cladding layer 402, the p-type cladding layer 409, and the barrier layers 408 each made of $Zn_{0.9}4Mg_{0.06}S_{0.12}Se_{0.88}$, these layers can be made of other group II-VI semiconductor materials such as ZnTeSSe, which has a composition ratio selected so as to secure the lattice matching with the substrate 401 made of n-GaAs. Further, the effect of the present invention can also be obtained when a quantum well laser is manufactured by using InP as a substrate and ZnMgCdSe as cladding layers and barrier layers.

Materials to be used for the quantum well structure of the present invention are not limited to the combination of compound semiconductors as described in the above examples. Any other combination of compound semiconductors can be used as long as the band offset (ΔEc) of the conduction band and the band offset (ΔEv) of the valence band can be controlled as desired and the energy differences Ege-o of the quantum well layers can be set to be substantially the same by selecting the lattice mismatching rate and the thickness of each of the quantum well layers. As described above, it is possible to predict the band offsets/ ΔEv and ΔEc in a double hetero structure composed of any combination of compound semiconductors, by using a theoretical calculation. Thus, based on such a prediction, a layer having compressive strain and/or a layer having tensile strain can be disposed with regard to a first cladding layer and a second cladding layer, such as a p-type cladding layer and an n-type cladding layer, in a manner according to either the first example or the second example, thereby appropriately designing a quantum well structure made of a varied combination of compound semiconductors.

The quantum well structure 100 includes a layer having tensile strain, a layer having no strain, and a layer having compressive strain. However, the quantum well structure of the present invention does not necessarily include all of these three kinds of layers, as illustrated below by way of a third example of the semiconductor laser of the present invention.

The third example of the semiconductor laser also has the same type of laminated structure as that of the semiconductor laser of the first example, and thus will be also described with reference to FIG. 4.

This semiconductor laser comprises a substrate 401 made of n-GaAs, an n-type cladding layer 402 made of n-ZnCdMgS, quantum well layers having compressive strain 403, 404 and 405 made of ZnCdMgS, quantum well layers having no strain 406 and 407 made of ZnCdMgS, barrier layers 408 made of ZnCdMgS, a p-type cladding layer 409 made of p-ZnCdMgS, a current confining layer 410 made of n-GaAs, a contact layer 411 made of p-GaAs, and a pair of electrodes 412 and 413. The quantum well layers having no strain 406 and 407 have a composition ratio which shows lattice matching with the substrate, the cladding layers and the barrier layers. The quantum well layers having compressive strain 403, 404 and 405 have a composition ratio which shows a larger lattice constant than the other layers. This semiconductor laser can be manufactured in the same manner as described in the first example.

In case of a double hetero structure such as used in the third example, which is made of group II-VI semiconductors having the same anion (i.e., group VI elements), the band offset (ΔEv) of the valence band is generally known to be very small, for example as low as about 0.05 eV. In the third example, application of compressive strain to the quantum well layers 403, 404 and 405 results in an increase in the band offset ΔEv which prevents holes from overflowing to the n-type cladding layer. On the other hand, since the quantum well structure of the third example inherently includes a sufficiently large band offset (ΔEc) of the conduction band, it is not necessary to apply tensile strain to a quantum well layer that is adjacent to the p-type cladding layer as in the case of the semiconductor laser of the second example.

Contrary to the case of the third example, the inherent characteristics of a quantum well structure may make it particularly desirable to be improved so as to prevent electrons from overflowing. In such a case, appropriate strain can be applied to a quantum well layer that is adjacent to the cladding layer through which holes are injected, such as a p-type cladding layer, so that the quantum well layer has a sufficiently large band offset (ΔEc) of the conduction band. On the other hand, in such a quantum well structure, it is not necessarily important to control the band offset (ΔEv) of a quantum well layer that is adjacent to the cladding layer through which electrons are injected, such as an n-type cladding layer.

As is apparent from the above descriptions, according to the present invention, the energy barriers within a quantum well structure can be controlled as desired, thereby efficiently confining electrons and holes in quantum well layers of the quantum well structure. Therefore, the present invention can be used for example, to improve the characteristics of a semiconductor laser, especially those observed in an operation at a higher temperature.

The quantum well structure of the present invention is not only applied to a semiconductor laser, but also to the other light emitting devices, such as a light emitting diode (LED), as illustrated below.

Figure 7:
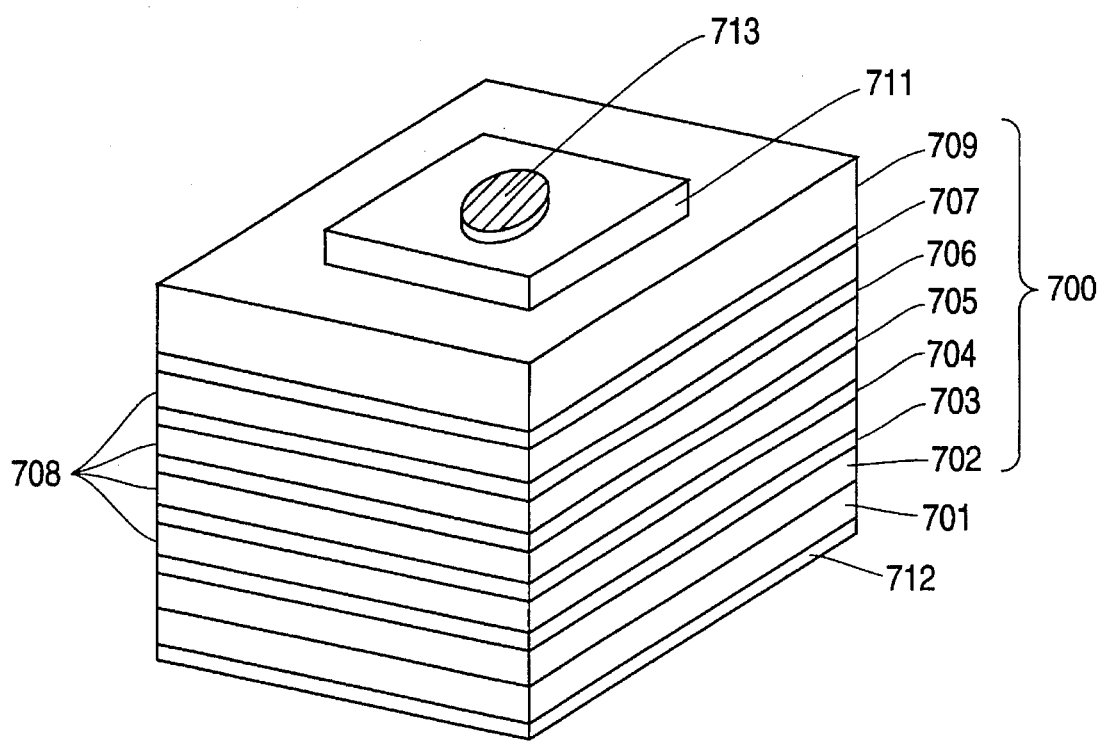
FIG. 7 is a schematic perspective view illustrating an example of the light emitting diode which includes the quantum well structure of the present invention.
Figure 8:
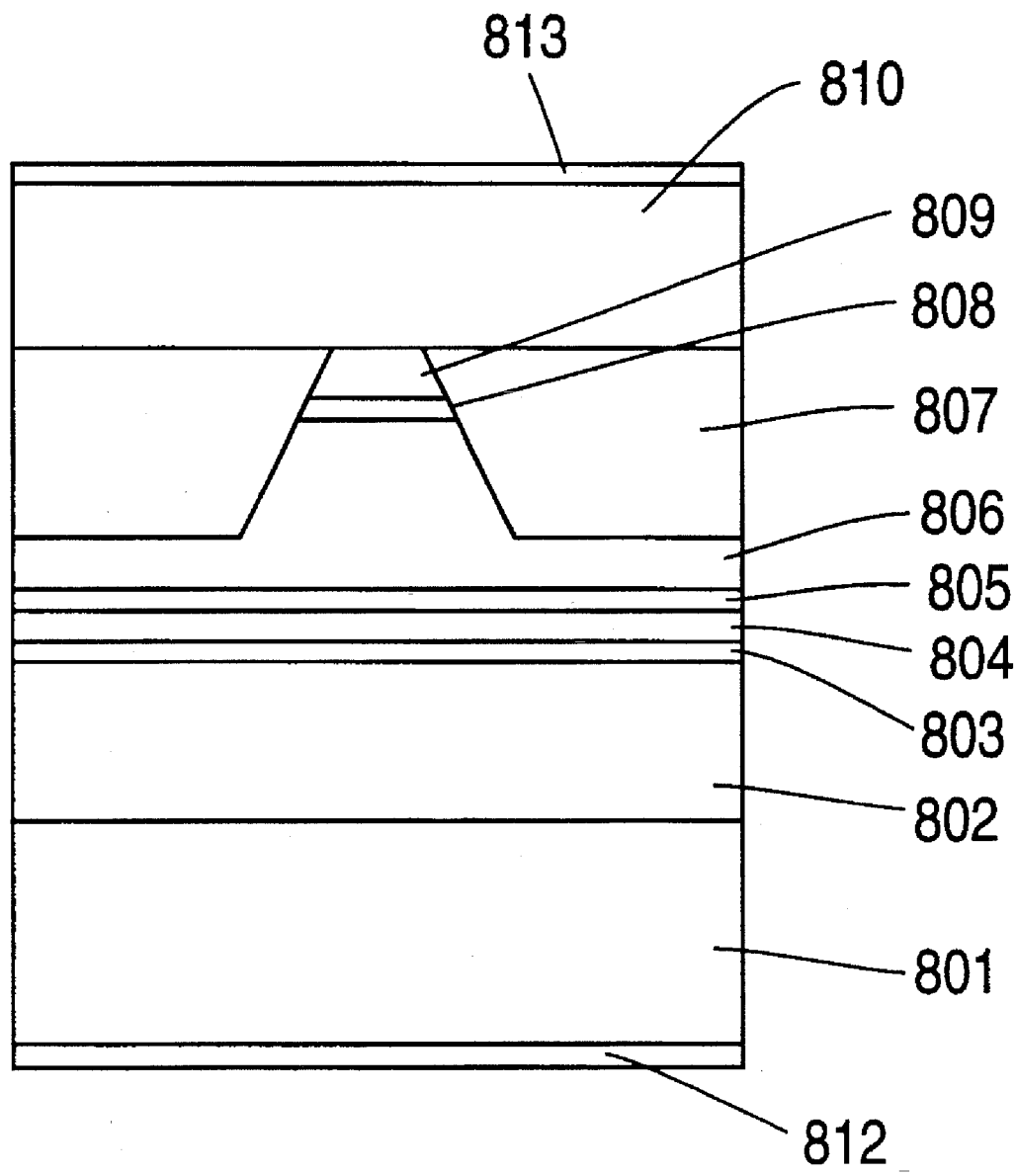
FIG. 8 is a schematic front view illustrating a conventional semiconductor laser.

FIG. 7 shows an example of the light emitting diode (LED) according to the present invention.

This LED is composed of a substrate 701 made of n-GaAs, an n-type cladding layer 702 made of n-$(Al_{0.5}Ga_{0.5})_{0.52}In_{0.48}P$, quantum well layers 703 and 704 made of $Ga_{1-x}In_xP$ (x=0.39), a quantum well layer 705 made of $Ga_{1-x}In_xP$ (x=0.48), quantum well layers 706 and 707 made of $Ga_{1-x}In_xP$ (x=0.56), undoped barrier layers 708 made of un-$(Al_{0.5}Ga_{0.5})_{0.52}In_{0.48}P$, a p-type cladding layer 709 made of p$(Al_{0.5}Ga_{0.5})_{0.52}In_{0.48}P$, a contact layer 711 made of pGaAs, and a pair of electrodes 712 and 713. Thus, an active region 700 of the LED is the same as the quantum well structure 100 of FIG. 1.

In the LED of FIG. 7, the contact layer 711 is formed so as not to cover the top face of the p-type cladding layer 709 entirely. As a result, the amount of light absorbed by the contact layer 709 is reduced. The electrode 713 has a round shape as shown in FIG. 7, and is placed above the center of the top face of the active region 700, so as not to hinder significantly the emission of light from the top face of the active region 700.

Because of including the quantum well structure of the present invention, the LED of this example also has improved characteristics due to the capability of efficiently confining the injected electrons and holes.

Further, application of the quantum well structure of the present invention to an electronic device may enable it to efficiently confine electrons in an active region, thereby improving the characteristics of such an electronic device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A quantum well structure comprising:

a first cladding layer;

a second cladding layer; and a plurality of quantum well layers and one or more barrier layers each disposed between the first cladding layer and the second cladding layer, the quantum well layers and the barrier layers being laminated in an alternating manner;

wherein the quantum well layers include at least two selected from the group consisting of a layer having tensile strain, a layer having no strain, and a layer having compressive strain; and wherein the thickness of each of the quantum well layers is selected so that the energy difference in each of the quantum well layers between the ground quantum state of an electron at the conduction band and the ground quantum state of a hole at the valence band is substantially the same.

2. A quantum well structure according to claim 1, wherein the layer having tensile strain includes the quantum well layer that is disposed closest to the first cladding layer.

3. A quantum well structure according to claim 1, wherein the layer having compressive strain includes the quantum well layer that is disposed closest to the first cladding layer.

4. A quantum well structure according to claim 1, wherein the quantum well layers include the layer having tensile strain, the layer having compressive strain and the layer having no strain, the layer having no strain being disposed between the layer having tensile strain and the layer having compressive strain.

5. A quantum well structure according to claim 4, wherein the layer having tensile strain includes the quantum well layer that is disposed closest to the first cladding layer, and the layer having compressive strain includes the quantum well layer that is disposed closest to the second cladding layer.

6. A semiconductor light emitting device comprising the quantum well structure according to claim 1 as an active region.

7. A semiconductor laser comprising the quantum well structure according to claim 1 as an active region.

8. A quantum well structure comprising:

an n-type cladding layer;

a p-type cladding layer; and a plurality of quantum well layers and one or more barrier layers each disposed between the n-type cladding layer and the p-type cladding layer, the quantum well layers and the barrier layers being laminated in an alternating manner;

wherein the quantum well layers include at least two selected from the group consisting of a layer having tensile strain, a layer having no strain, and a layer having compressive strain, so that the quantum well layer that is disposed closest to the n-type cladding layer has the largest band offset (Ev) of the valence band among the quantum well layers, and the quantum well layer that is disposed closest to the p-type cladding layer has the largest band offset (Ec) of the conduction band among the quantum well layers; and wherein the thickness of each of the quantum well layers is selected so that the energy difference in each of the quantum well layers between the ground quantum state of an electron at the conduction band and the ground quantum state of a hole at the valence band is substantially the same.

9. A semiconductor light emitting device comprising the quantum well structure according to claim 8 as an active region.

10. A semiconductor laser comprising the quantum well structure according to claim 8 as an active region.

* * * * *

UNITED STATES PATENT AND TRADEMARK OFFICE
CERTIFICATE OF CORRECTION

PATENT NO. : 5,473,173                                Page 1 of 2

DATED     :   December 5, 1995

INVENTOR(S) :   Haruhisa Takiguchi et al.

It is certified that error appears in the above-identified patent and that said Letters Patent is hereby corrected as shown below:

In column 3, line 25, after "invention" please insert -- , --.

In column 3, line 42, please change "Electric" to -- Electronic --.

In column 3, line 50, please change

"$Evmax=(Ep^c+Ep^a)/2-[((Ep^c-Cp^a)/2)^2+Vxx^2]^{1/2}$" to

-- $Evmax=(Ep^c+Ep^a)/2-[((Ep^c-Ep^a)/2)^2+Vxx^2]^{1/2}$ --.

In column 4, line 7, please change

"$Ev,hh, strain=[Ev-(1/3)\Delta_0 j+dEv,ac+dEv,hh$" to

-- $Ev,hh,strain=[Ev-(1/3)\Delta_0]+dEv,av+dEv,hh$ --.

In column 4, line 18, please change "dec" to -- dEc --.

In column 4, line 21, after "*Phys. Rev. B*," please change "839" to -- 39 --.

In column 4, line 48, please change "dec" to -- $\Delta Ec$ --.

UNITED STATES PATENT AND TRADEMARK OFFICE
CERTIFICATE OF CORRECTION

PATENT NO. : 5,473,173                            Page 2 of 2
DATED      : December 5, 1995
INVENTOR(S) : Haruhisa Takiguchi et al.

It is certified that error appears in the above-indentified patent and that said Letters Patent is hereby corrected as shown below:

In column 10, line 45, after "necessary to apply", please delete ".".

Signed and Sealed this

Eleventh Day of June, 1996

Attest:

BRUCE LEHMAN

Attesting Officer          Commissioner of Patents and Trademarks